(12) United States Patent
Hummler

(10) Patent No.: US 7,420,862 B2
(45) Date of Patent: Sep. 2, 2008

(54) DATA INVERSION DEVICE AND METHOD

(75) Inventor: Klaus Hummler, Apex, NC (US)

(73) Assignee: Infineon Technologies AG, Munich (DE)

( * ) Notice: Subject to any disclaimer, the term of this patent is extended or adjusted under 35 U.S.C. 154(b) by 186 days.

(21) Appl. No.: 11/410,635

(22) Filed: Apr. 25, 2006

(65) Prior Publication Data

US 2007/0250657 A1    Oct. 25, 2007

(51) Int. Cl.
  *G11C 7/00*   (2006.01)
(52) U.S. Cl. .................................. 365/205; 365/207
(58) Field of Classification Search ................. 365/205, 365/207, 208, 230.02
  See application file for complete search history.

(56) References Cited

U.S. PATENT DOCUMENTS

| | | | | |
|---|---|---|---|---|
| 5,426,609 | A | * | 6/1995 | Okuda ........................ 365/201 |
| 5,487,048 | A | * | 1/1996 | McClure ..................... 365/207 |
| 5,808,487 | A | * | 9/1998 | Roy ............................. 327/55 |
| 5,917,748 | A | * | 6/1999 | Chi et al. .................... 365/168 |
| 5,953,275 | A | * | 9/1999 | Sugibayashi et al. ........ 365/207 |
| 6,633,951 | B2 | | 10/2003 | Cohen |
| 6,768,686 | B2 | * | 7/2004 | Frey ....................... 365/189.07 |

* cited by examiner

*Primary Examiner*—Vu A Le
(74) *Attorney, Agent, or Firm*—Dicke, Billig & Czaja, PLLLC

(57) ABSTRACT

An inversion device includes a differential amplifier having first and second input lines, and a controller coupled to the first and second input lines to selectively and individually decouple the first and second input lines from the differential amplifier.

26 Claims, 4 Drawing Sheets

DATA INVERSION DEVICE AND METHOD

BACKGROUND

Memory speed and memory capacity continue to increase to meet the demands of system applications. Some of these system applications include mobile electronic systems that have limited space and limited power resources. In mobile applications, such as cellular telephones and personal digital assistants (PDAs), memory cell density, power consumption and speed are issues for future generations. There is also continued need for an increase in speed in accessing data stored in memory. In some memory applications there is a need to rapidly change data that is stored in the memory, and in some cases, on a global basis. Rapidly changing the state of data is desirable in other data processing applications as well.

SUMMARY

One embodiment of the present invention provides a differential amplifier having first and second input lines, and a controller coupled to the first and second input lines. The controller selectively and individually decouples the first and second input lines from the differential amplifier.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
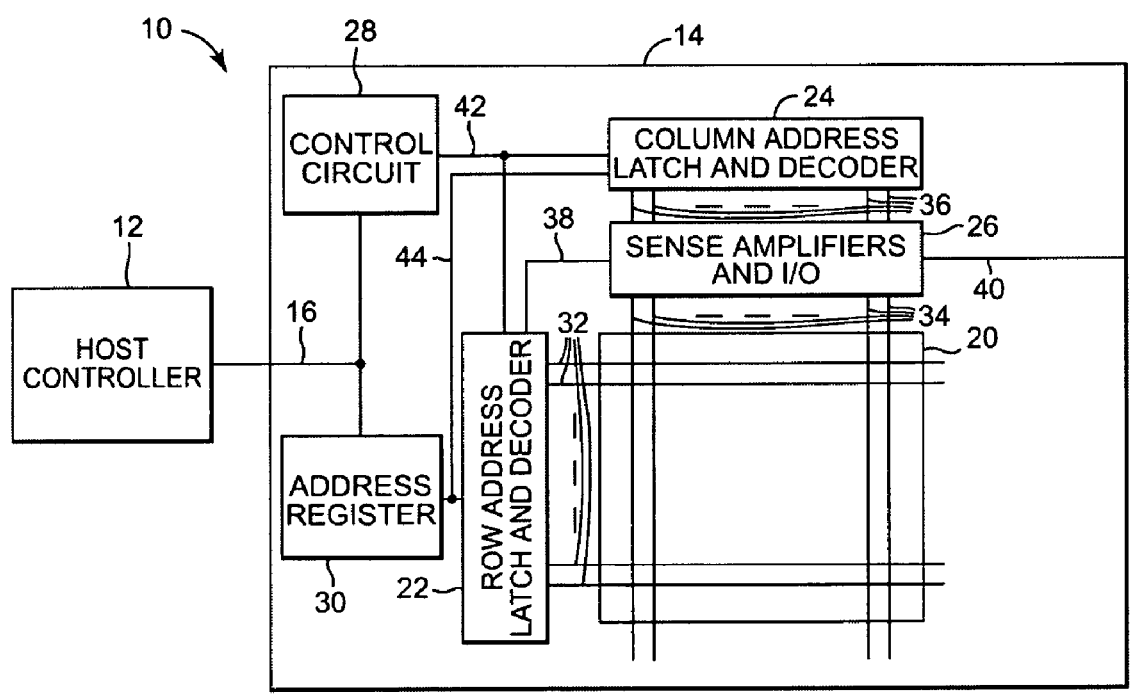
FIG. 1 is a block diagram illustrating an electronic system according to one embodiment of the present invention.

FIG. 1 is a block diagram illustrating one embodiment of an electronic system 10, according to one embodiment of the present invention. Electronic system 10 includes a host controller 12 and a random access memory 14. In one case, memory 14 is a dynamic random access memory (DRAM). However, memory 14 may be any other memory device.

Host controller 12 is electrically coupled to memory 14 through memory communications path 16. Host controller 12 provides row and column addresses and control signals to memory 14 through memory communications path 16. In one embodiment, host controller 12 provides control signals including read/write enable, row address strobe (RAS), and column address strobe (CAS) signals. In one embodiment, memory 14 is a pseudo static random access memory (PSRAM) and host controller 12 provides control signals including static RAM (SRAM) control signals.

Memory 14 includes an array of memory cells 20, a row address latch and decoder 22, a column address latch and decoder 24, a sense amplifier and input/output (I/O) circuit 26, a control circuit 28, and an address register 30. Conductive word lines 32, referred to as row select lines, extend in one direction across the array of memory cells 20. Conductive bit lines 34, referred to as bit lines, extend across the array of memory cells 20 in a perpendicular direction relative to word lines 32. A memory cell is located at each cross point of a word line 32 and a bit line 32 pair.

Each word line 32 is electrically coupled to row address latch and decoder 22, and each bit line 34 is electrically coupled to one of the sense amplifiers in sense amplifier and I/O circuit 26. Sense amplifier and I/O circuit 26 is electrically coupled to column address latch and decoder 24 through conductive column select lines 36. Also, sense amplifier and I/O circuit 26 is electrically coupled to row address latch and decoder 22 through communication lines 38 and to data I/O pads or pins, referred to as DQs, through I/O communications path 40. Data is transferred between sense amplifier and I/O circuit 26 in memory 14 and an external device, such as host controller 12, through I/O communications path 40.

Host controller 12 is electrically coupled to control circuit 28 and address register 30 through memory communications path 16. Control circuit 28 is electrically coupled to row address latch and decoder 22 and column address latch and decoder 24 through control communications path 42. Address register 30 is electrically coupled to row address latch and decoder 22 and column address latch and decoder 24 through row and column address lines 44.

Control circuit 28 receives addresses and control signals from host controller 12 through memory communications path 16. In one embodiment, host controller 12 provides control signals including read/write enable, RAS, and CAS signals to control circuit 28. In one embodiment, memory 14 is a PSRAM and host controller 12 provides control signals including SRAM control signals to control circuit 28 that provides the DRAM control signals, such as read/write enable, RAS, and CAS signals.

Address register 30 receives row and column addresses from host controller 28 through memory communications path 16. Address register 30 supplies a row address to row address latch and decoder 22 through row and column address lines 44. Control circuit 28 supplies a RAS signal to row address latch and decoder 22 through control communications path 42 to latch the supplied row address into row address latch and decoder 22. Address register 30 supplies a column address to column address latch and decoder 24 through row and column address lines 44. Control circuit 28 supplies a CAS signal to column address latch and decoder 24 through control communications path 42 to latch the supplied column address into column address latch and decoder 24.

Row address latch and decoder 22 receives the row addresses and RAS signals and latches the row addresses into row address latch and decoder 22. Also, row address latch and decoder 22 decodes each of the row addresses to select a row of memory cells in cell array 20. In addition, row address latch and decoder 22 provides sense amplifier activation signals and equalization and precharge signals to sense amplifier and I/O circuit 26 through communications path 38.

Column address latch and decoder 24 activates column select lines 36 to connect sense amplifiers to I/O circuits in sense amplifier and I/O circuit 26. Column address latch and decoder 24 receives a column address and latches the column address into column address latch and decoder 24. Also, column address latch and decoder 24 decodes the column address to select addressed column select lines 36. In addition, column address latch and decoder 24 receives column select line activation signals from control circuit 28 through control communications path 42. The column select line activation signals indicate which of the addressed column select lines 36 are to be activated by column address latch and decoder 24. Column address latch and decoder 24 activates column select lines 36 that are addressed by the column address and selected for activation by the column select line activation signals. Activated column select lines 36 are provided to sense amplifier and I/O circuit 26 to connect sense amplifiers to I/O circuits.

Column select lines 36 are grouped into column segments. Each column segment includes a group of column select lines 36 that correspond to a set of sense amplifiers and I/O circuits. Multiple column select lines 36 in a column segment can share one I/O circuit in the set of I/O circuits, alternatively connecting a sense amplifier to the shared I/O circuit. Column select lines 36 in an adjacent column segment connect sense amplifiers to a different corresponding set of I/O circuits.

Sense amplifier and I/O circuit 26 includes sense amplifiers, equalization and precharge circuits, data input buffers, and data output buffers. The sense amplifiers are differential input sense amplifiers and each sense amplifier receives one bit line at each of the two differential inputs. One of the bit lines receives a data bit from a selected memory cell and the other bit line is used as a reference. The equalization and precharge circuits equalize the voltage on bit lines connected to the same sense amplifier prior to a read or write operation. In a typical memory device (e.g. DRAM) all data along a physical page is sensed simultaneously after activation of the word line by the bank of sense amplifiers located at the edge of the array.

Figure 2:
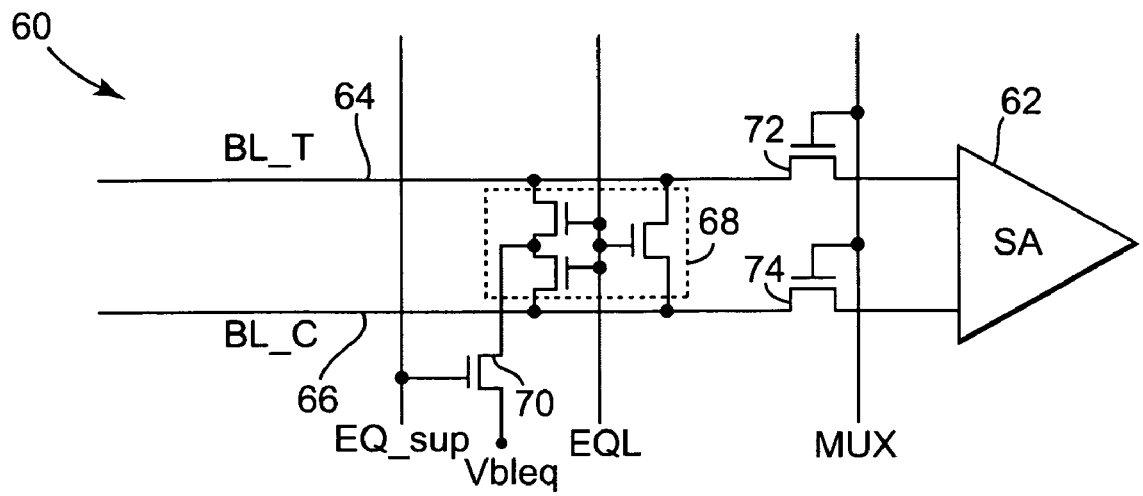
FIG. 2 is a diagram illustrating one example of a memory cell in an array of memory cells.

FIG. 2 illustrates an example of a sense amplifier circuit 60 for a typical memory array. Sense amplifier circuit 60 includes a sense amplifier 62 that is connected to a pair of bit lines 64 and 66. A first bit line 64 is configured to receive the cell signal while a second bit line 66 serves as the reference against which sense amplifier 62 senses the cell signal. Once fully sensed one bit line will be at bit line high voltage (Vblh) and the other bit line in the bit line pair will be at ground. In this way, first bit line 64 is called "true bit line" (BL_T) because a physical high cell signal on BL_T will result in a logical "one" signal at the output, typically the I/O port of the semiconductor chip. Second bit line 66 of the pair is called a "complement bit line" (BL_C) because it behaves opposite to first bit line 64.

Typically, a single sense amplifier 62 is shared between two memory arrays in order to save space in the memory device. In this way, a pair of bit lines identical to bit line pair 64 and 66 is typically also coupled to sense amplifier 62 (additional identical bit line pair not illustrated in FIG. 2). Because each sense amplifier 62 is shared, they also include first and second multiplexer transistors 72 and 74 configured to receive a multiplexer signal (MUX signal). The MUX signal selectively connects and disconnects the bit lines and the memory array to and from sense amplifier 62.

In addition, first and second bit lines 64 and 66 have equalization transistors 68 connected between them so that first and second bit lines 64 and 66 can be pre-charged to the equalization voltage (Vbleq signal) in order to be ready for the next sensing cycle. An equalization signal (EQL signal) controls equalization transistors 68, which short the two bit lines 64 and 66 together as well as supply the Vbleq signal to each bit line 64 and 66. An additional supply transistor 70 supplies the Vbleq signal to the equalization transistors 68 (EQ_sup signal). In this typical sense amplifier circuit 60, the EQ_sup signal is always turned on.

Figure 3:
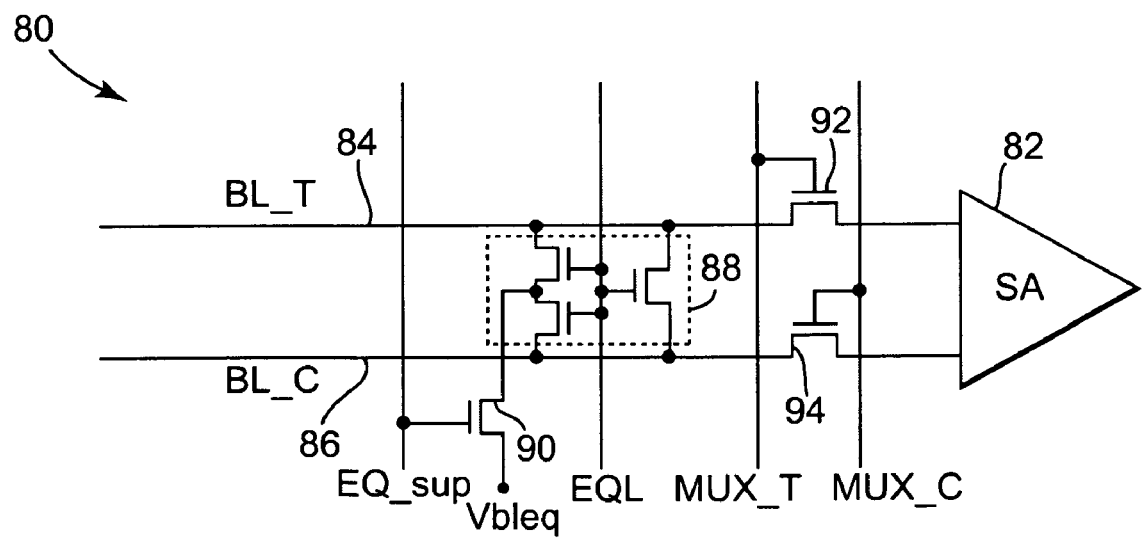
FIG. 3 is a diagram illustrating a memory cell in an array of memory cells according to one embodiment of the present invention.

FIG. 3 illustrates a sense amplifier circuit 80 in accordance with an embodiment of the present invention. Similar to sense amplifier circuit 60 above, sense amplifier circuit 80 includes a sense amplifier 82 that is connected to a pair of bit lines 84 and 86. A first bit line 84 is configured to receive the cell signal while a second bit line 86 serves as the reference against which sense amplifier 82 senses the cell signal. First bit line 84 is called "true bit line" (BL_T) and second bit line 86 of the pair is called a "complement bit line" (BL_C).

As with sense amplifier circuit 60 above, sense amplifier circuit 80 includes a single sense amplifier 82 that is shared between two memory arrays in order to save space in the memory device (only a single bit line pair 84 and 86 is illustrated in FIG. 3). Because each sense amplifier 82 is shared, they also include first and second multiplexer transistors 92 and 94.

In addition, first and second bit lines 84 and 86 have equalization transistors 88 connected between them so that first and second bit lines 84 and 86 can be pre-charged to the equalization voltage (Vbleq signal) in order to be ready for the next sensing cycle. An equalization signal (EQL signal) controls equalization transistors 88, which short the two bit lines 84 and 86 together as well as supply the Vbleq signal to each bit line 84 and 86. An additional supply transistor 90 supplies the Vbleq signal to the equalization transistors 88 (EQ_sup signal). In one embodiment, supply transistor 90 supplies the EQ_sup signal to the single transistor BL pair 84 and 86, and in another embodiment an additional supply transistor is used such that EQ-sup signal is shared between two bit line pairs.

In one embodiment of sense amplifier circuit 80, the EQ_sup signal is selectively controlled so that it can be turned on or off. Furthermore, in sense amplifier circuit 80, first and second multiplexer transistors 92 and 94 are configured to receive a separate multiplexer signal, MUX_T and MUX_C, to control BL_T and BL_C, respectively. In normal operation, these separate multiplexer signals can be tied together in order to selectively connect and disconnect the bit lines and the memory array to and from sense amplifier 82. In one embodiment of the invention, however, the separate multiplexer signals MUX_T and MUX_C and the selective control over the EQ_sup signal are used to perform a rapid full-page data inversion for the memory device. As such, each of the memory cells of multiple word lines and/or full pages of a memory device can be quickly inverted with few process steps.

Figure 4:
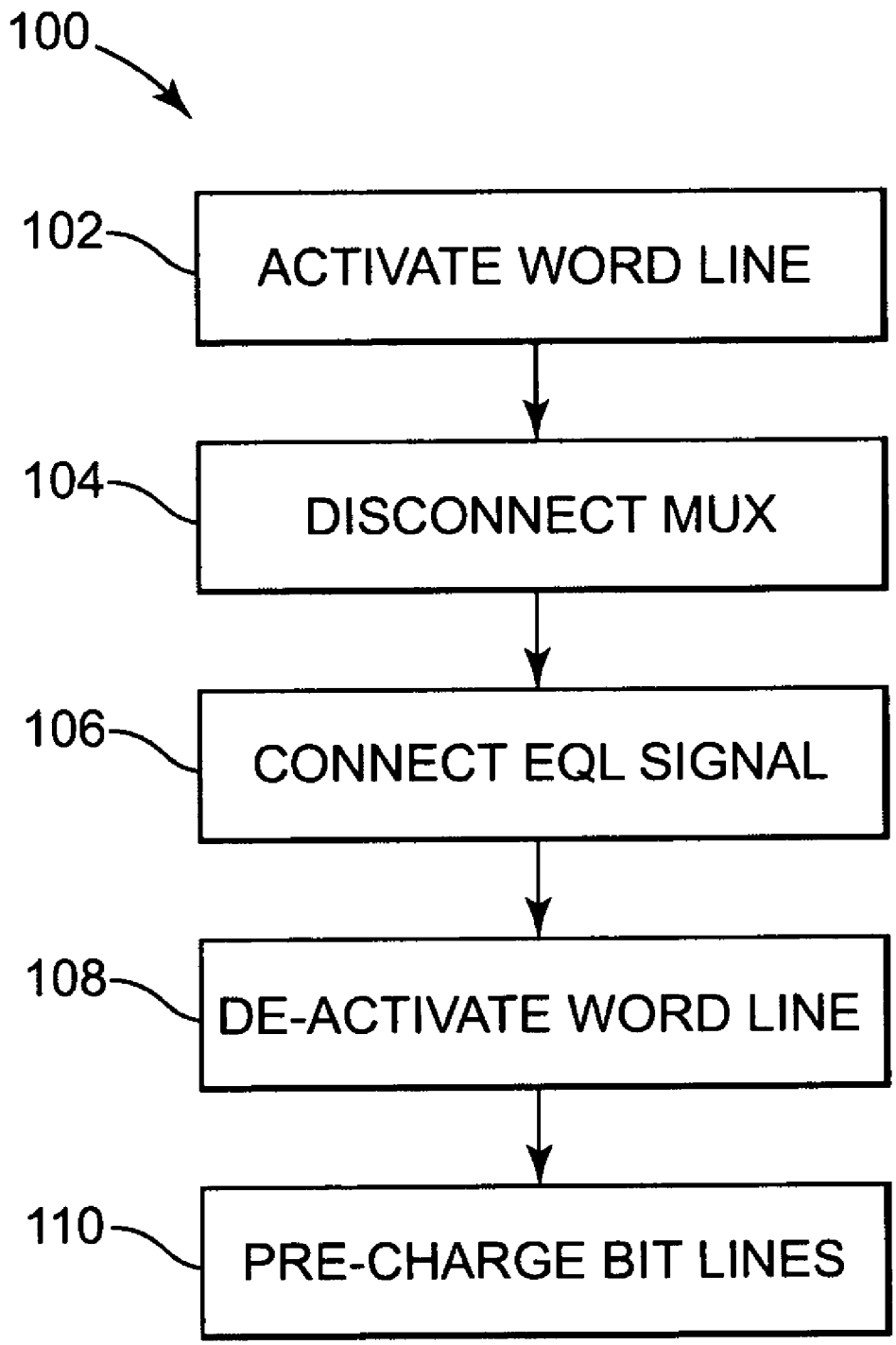
FIG. 4 is a flow diagram illustrating one embodiment of a method for full-page data inversion.

FIG. 4 is a flow diagram illustrating one embodiment of a method 100 for full-page data inversion with sense amplifier circuit 80. In one embodiment, sense amplifier circuit 80 is configured within random access memory 14 of electronic system 10. Thus, a full page data inversion in one embodiment inverts data in all the memory cells of memory cell array 20 quickly and with relatively few process steps.

In one embodiment, each of the memory cells to be inverted is connected to the "true" bit line BL_T. At step 102, a word line 32 is activated and data is sensed. In order to activate a word line 32 and sense data, MUX_T and MUX_C signals are connected to BL_T and BL_C, respectively, via multiplexer transistors 92 and 94. Also, EQL and EQ_sup signals are disconnected from the equalization transistors 88. As such, sense amplifier 82 pulls BL_T high when the memory cell contains a physical one. Similarly, sense amplifier 82 pulls BL_T low when the memory cell contains a physical zero. In either case, BL_C will end up in the opposite state of BL_T.

At step 104, MUX_T signal is disconnected from BL_T via multiplexer transistors 92. In this way, the true bit line BL_T is cut off from sense amplifier 82. Next, at step 106 the EQL signal is connected to equalization transistors 88. Connecting the EQL signal shorts BL_T and BL_C together such that BL_T will assume the opposite data state. Because the word line 32 is still active, the memory cell will instantly receive the opposite data.

Then at step 108, word line 32 is deactivated. In this way, the inverted data is successfully written into all memory cells along the word line 32. Finally, at step 110, all the bit lines are pre-charged in order to equalize voltage on the bit lines prior to a read or write operation. The bit lines are pre-charged by connecting EQ_sup to supply transistor 90 and connecting MUX_T to multiplexer transistor 92. Using these steps, all the data along a physical page can be inverted with almost the same timing as the row cycle time in normal operation.

Such a rapid full-page data inversion along the physical page of a memory device can be desirable in a variety of applications. Such applications include many error correction schemes that correct bit errors introduced into reading from and writing to memory, often referred to as error correction codes or ECC. Rapid inversion of data in memory cells can be useful in generating parity bits used in ECC applications.

In addition, full-page data inversion can be used in cases where a defined physical data topology is generated in the memory array for testing purposes. Other examples include certain graphics applications where rapid inversion of an entire page at the memory controller level can save processor time for the graphics processor.

Some prior designs for data inversion utilize transfer cells, essentially DRAM cells, that are connected to both the true and the complement bit line. Building transfer cells, however can be disruptive to the memory array, and can add cost. The proposed method for rapid data inversion along a physical page of electronic system 10, or word line 32 of a memory device, can be realized with relatively minor alterations to typical circuitry used in many memory devices. With electronic system 10 and sense amplifier circuit 80, data inversion is added to a memory array by using multiplexers that are typically already present in many current DRAM designs. As such, little modification of the memory device is needed. Furthermore, by using mostly existing components, any increase in capacitance on the multiplexer from adding a separate line to BL_T and BL_C is minimal. In this way, most of the same timing rates are maintained.

Figure 5:
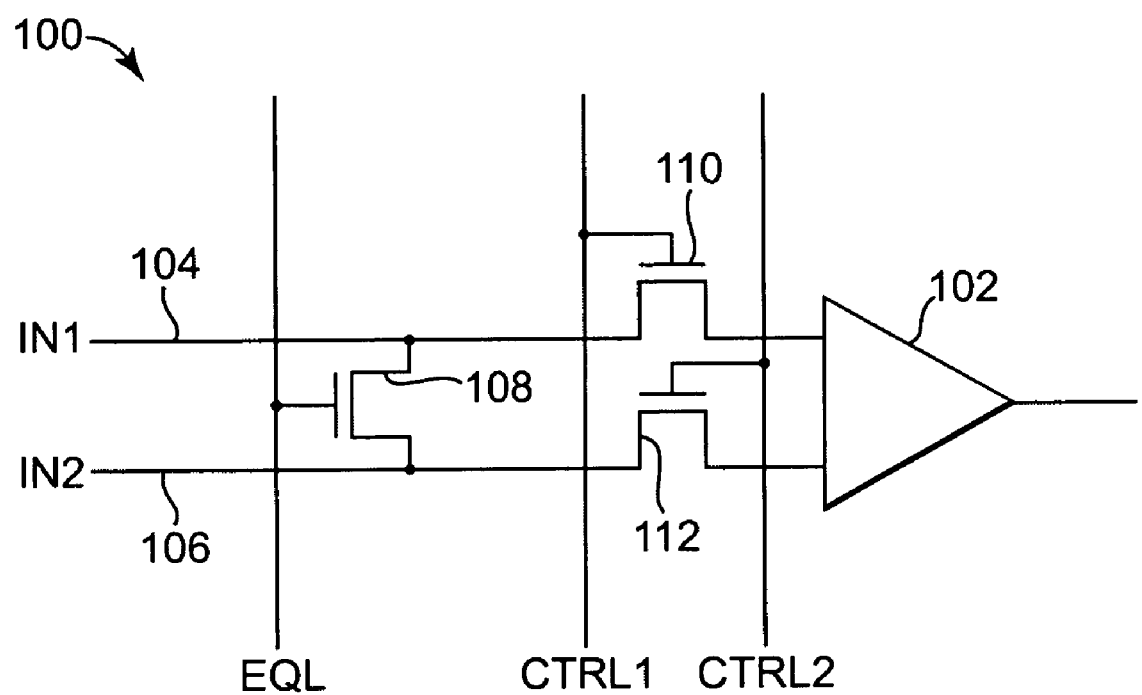
FIG. 5 is a diagram illustrating another embodiment of the invention.

FIG. 5 illustrates another embodiment of the present invention. A data conversion device 100 includes a differential amplifier 102 having a first input line IN1 104 and a second input line IN2 106. The first and second input lines 104 and 106 are coupled to first and second control transistors 110 and 112, respectively. The first control transistor 110 receives a first control signal CTRL1 and the second control transistor receives a second control signal CTRL2. Another transistor 108 is connected between the first and second input lines 104 and 106, and receives an equalization signal EQL. The equalization signal EQL controls the transistor 108 to short the two input lines IN1 and IN2 together.

According to the embodiment illustrated in FIG. 5, data on the first input line 104 can rapidly be converted to the value of data on the second input line 106 by decoupling the first control transistor 110 on the first input line 104, and shorting the first and second input lines 104 and 106 together via the transistor 108. The first control transistor 110 is decoupled from the first input line 104 in response to the first control signal CTRL1, which disconnects the first input line 104 from the differential amplifier 102. The transistor 108 shorts the first and second input lines in response to activation of the EQL signal. In this manner, the first input line 104 will assume the value of the second input line 106. Data on the second input line 106 can also be rapidly converted to the value of the first input line 104 by decoupling the second control transistor 112 on the second input line 106 and shorting the first and second input lines 104 and 106 together via transistor 108.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An inverting device, comprising:
    a differential amplifier having first and second input lines configured to carry a differential signal comprising a first state on the first input line and a second state complementary to the first on the second input line;
    a shorting device coupled between the first and second input lines; and
    a controller coupled to the first and second input lines of the differential amplifier;
    wherein the controller is arranged to selectively decouple one of the first state of the differential line and the second state of the differential line from the differential amplifier.

2. The inverting device of claim 1, wherein the controller and the shorting device are controlled such that one of the first and second input lines receives the value on the other one of the first and second input lines.

3. The inverting device of claim 1, wherein the controller comprises a first multiplexer coupled to the first input line of the differential amplifier, and a second multiplexer transistor coupled to the second input line of the differential amplifier.

4. The inverting device of claim 1, wherein the shorting device comprises a transistor.

5. A method of inverting a value on a first input to a differential amplifier to a value on a second input to the differential amplifier, the differential amplifier receiving at the first input a first state of a differential signal and at the second input a second state of the differential signal complementary to the first state, comprising:
    decoupling the first state of the differential signal from the differential amplifier; and shorting the first input to the second input of the differential amplifier such that the first input to the differential amplifier assumes the value on the second input to the differential amplifier.

6. A memory comprising:
a sense amplifier segment;
a plurality of word lines;
a first and a second bit line each coupled to the sense amplifier segment; and
a memory cell located at each cross point of the word lines and the bit lines;
a first control segment coupled to the first bit line and a second control segment coupled to the second bit line, wherein the first and a second control segments selectively and individually decouple the first and a second bit lines from the sense amplifier segment.

7. The memory of claim 6, wherein the first bit line is a true bit line coupled to receive a memory cell signal and the second bit line is complementary to the first bit line.

8. The memory of claim 7, wherein the first control segment includes a first multiplexer transistor coupled between the first bit line and the sense amplifier segment, wherein the second control segment includes a second multiplexer transistor coupled between the second bit line and the sense amplifier segment, and wherein the first and second multiplexer transistors respectively receive a first and second multiplexer signal that controls the first and second multiplexer transistors thereby selectively decoupling the first and a second bit lines from the sense amplifier segment.

9. The memory of claim 8, further comprising equalization transistors coupled between the first and second bit lines such that the first and second bit lines can be selectively shorted together and pre-charged to an equalization voltage.

10. The memory of claim 9, wherein an equalization signal controls the equalization transistors.

11. A memory comprising:
a sense amplifier segment;
a plurality of word lines;
a true bit line and a complementary bit line each coupled to the sense amplifier segment; and
a memory cell storing data located at each cross point of the word lines and the true bit lines;
a first control segment coupled between the true bit line and the sense amplifier segment for selectively decoupling the true bit lines from the sense amplifier segment;
a second control segment coupled between the complementary bit line and the sense amplifier segment for selectively decoupling the complementary bit lines from the sense amplifier segment; and
equalization transistors coupled between the true and complementary bit lines.

12. The memory of claim 11, wherein the equalization transistors are configured such that the true and complementary bit lines can be selectively shorted together and pre-charged to an equalization voltage.

13. The memory of claim 12, wherein the first and second control segments and the equalization transistors are controlled such that data stored in each memory cell is complimented with the complementary bit line.

14. The memory of claim 13, wherein each memory cell for an entire page of memory is so complimented with the complementary bit line.

15. The memory of claim 11, wherein the memory is a dynamic random access memory.

16. A memory comprising:
a sense amplifier segment;
a plurality of word lines;
a true bit line and a complementary bit line each coupled to the sense amplifier segment; and
a memory cell storing data located at each cross point of the word lines and the true bit lines; and
means for individually and selectively decoupling both the true and complementary bit lines from the sense amplifier segment.

17. The memory of claim 16, further comprising means for selectively shorting together the true and complementary bit lines in order to pre-charge the bit lines to an equalization voltage.

18. The memory of claim 16, further comprising means for complimenting the data stored in each memory by shorting the true and complementary bit lines such that the true bit line takes on the value of the complementary bit line.

19. The memory of claim 16, wherein each memory cell for an entire page of memory is complimented using the complementary bit line.

20. A method for inverting data in a memory, the method comprising:
activating a word line in a memory cell array to sense data stored in memory cells along the word line;
decoupling a true bit line from a sense amplifier, the true bit line being coupled to a memory cell having a first data state;
shorting a complementary bit line to the true bit line such that the memory cell coupled to the true bit line assumes a second data state opposite to the first data state; and
deactivating the word line so that the second state is stored in the memory cell.

21. The method of claim 20, further comprising pre-charging the bit lines such that the memory array is ready for a read or write operation.

22. The method of claim 21, wherein the true bit line is decoupled from the sense amplifier by selecting a multiplexer transistor that is coupled between the true bit line and the sense amplifier.

23. The method of claim 22, wherein complementary bit line is shorted to the true bit line by selecting equalization transistors coupled between the true and complementary bit lines.

24. The method of claim 23, wherein shorting the complementary bit line to the true bit line by selecting equalization transistors further comprises controlling the application of an equalization signal to the equalization transistors.

25. A method for inverting data in a memory, the method comprising:
activating a word line in a memory cell array to sense data stored in memory cells along the word line;
decoupling each true bit line from each sense amplifier activated by activating the word line, the true bit lines each being coupled to a memory cell having a first data state;
shorting each complementary bit line to a corresponding true bit line such that each memory cell coupled to each true bit line assumes an second data state opposite to the first data state; and
deactivating the word line so that the second state is stored in all of the memory cells.

26. The method of claim 25, wherein each memory cell for an entire page of memory is so complimented with complementary bit line.

* * * * *